United States Patent
Bush et al.

(12)

(10) Patent No.: US 6,359,461 B1
(45) Date of Patent: Mar. 19, 2002

(54) TEST STRUCTURE FOR DETERMINING THE PROPERTIES OF DENSELY PACKED TRANSISTORS

(75) Inventors: John J. Bush, Leander; Jon D. Cheek, Round Rock; H. Jim Fulford, Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/021,094

(22) Filed: Feb. 10, 1998

(51) Int. Cl.[7] .............................................. G01R 31/26
(52) U.S. Cl. ...................................... 324/769; 324/768
(58) Field of Search ................................. 324/769, 768, 324/765; 438/305, 300; 257/48, 401, 408

(56) References Cited

U.S. PATENT DOCUMENTS

| | | | |
|---|---|---|---|
| 3,751,647 A | | 8/1973 | Maeder et al. ............... 713/401 |
| 3,842,491 A | | 10/1974 | Depuy et al. .................. 438/14 |
| 5,142,224 A | * | 8/1992 | Smith et al. ................. 324/769 |
| 5,394,101 A | * | 2/1995 | Mitros ......................... 324/769 |
| 5,515,319 A | * | 5/1996 | Smalying ................ 365/185.27 |
| 5,553,274 A | | 9/1996 | Liebmann .............. 395/500.22 |
| 5,705,301 A | | 1/1998 | Garza et al. .................... 430/5 |
| 5,707,765 A | | 1/1998 | Chen .............................. 430/5 |
| 5,723,233 A | | 3/1998 | Garza et al. .................... 430/5 |
| 5,760,600 A | * | 6/1998 | Kasai .......................... 324/769 |
| 5,773,315 A | | 6/1998 | Jarvis .......................... 438/14 |
| 5,834,354 A | * | 11/1998 | Kadosh et al. ............... 438/305 |
| 5,854,115 A | * | 12/1998 | Gardner et al. .............. 438/305 |
| 5,888,872 A | * | 3/1999 | Gardner et al. .............. 438/305 |
| 5,889,410 A | * | 3/1999 | El-Kareh et al. ............ 324/769 |
| 5,908,315 A | * | 6/1999 | Gardner et al. .............. 438/305 |
| 5,916,715 A | * | 6/1999 | Fulford, Jr. et al. ........... 430/22 |
| 5,986,283 A | * | 11/1999 | Bush et al. .................. 324/765 |

* cited by examiner

*Primary Examiner*—Safet Metjahic
*Assistant Examiner*—Jermele M. Hollington
(74) *Attorney, Agent, or Firm*—Kevin L. Daffer; Conley, Rose & Tayon P.C.

(57) ABSTRACT

The present invention advantageously provides a test structure and method for determining the distinct characteristics of each transistor arranged in a densely packed configuration with other transistors. Formation of the test structure first involves forming gate conductors according to the configuration of the semiconductor topography whose device properties are being determined. That is, closely spaced gate conductors having relatively small lateral widths, i.e., physical gate lengths, are formed above a semiconductor substrate. All of the gate conductors except the one being tested are then etched from above the substrate. Source/drain implants which are self-aligned to the opposed sidewall surfaces of the gate conductor retained above the substrate are forwarded into the substrate. Absent the other gate conductors, the resulting source/drain regions may each have a larger lateral width greater than the distance between the pre-existing gate conductors. As such, the lateral width of contacts formed through an interlevel dielectric to the source/drain regions may be made significantly less than the lateral width of each source/drain region. Therefore, the contacts, and hence the contact openings, may be formed without being concerned that portions of the gate conductor might be etched and that the contacts might electrically communicate with the gate conductor.

19 Claims, 6 Drawing Sheets

TEST STRUCTURE FOR DETERMINING THE PROPERTIES OF DENSELY PACKED TRANSISTORS

BACKGROUND OF THE INVENTION

1. Field of the Invention

This invention relates to integrated circuit fabrication and, more particularly, to forming a test structure that may be used to determine the distinct properties of each transistor densely packed within the integrated circuit.

2. Description of the Related Art

Fabrication of a MOSFET device is well known. Generally speaking, MOSFETs are manufactured by placing an undoped polycrystalline silicon ("polysilicon") material over a relatively thin gate oxide. The polysilicon material and the gate oxide are then patterned to form a gate conductor with source/drain regions adjacent to and on opposite sides of the gate conductor. The gate conductor and source/drain regions are then implanted with an impurity dopant species. If the impurity dopant species used for forming the source/drain regions is n-type, then the resulting MOSFET is an NMOSFET ("n-channel") transistor device. Conversely, if the source/drain dopant species is p-type, then the resulting MOSFET is a PMOSFET ("p-channel") transistor device. Integrated circuits utilize either n-channel devices exclusively, p-channel devices exclusively, or a combination of both on a single substrate. While both types of devices can be formed, the devices are distinguishable based on the dopant species used.

Semiconductor fabrication involves producing a large number of identical integrated circuit devices upon a unitary semiconductor substrate in an array of rectangular elements called "dice". A few of those devices may be devoted to electrical testing while a majority of the devices are individually packaged to be used as computer hips. Reserving test areas of the substrate for electrical testing is necessary to ensure that functional devices are being manufactured. Further, the properties of the test devices (or test structures) are determined to ensure that optimum device performance is being achieved for the manufactured devices. Several transistor properties, e.g., drive current, $I_D$, and subthreshold current, $I_{Dst}$, may be determined using electrical testing of such test structures. Because of the increased desire to build faster and more complex integrated circuit devices, it has become necessary to form relatively small, closely spaced multiple transistors within a single integrated circuit device. Unfortunately, as the packing density of transistors within integrated circuit devices, and hence test structures increases, it becomes more difficult to electrically test a particular transistor within a dense grouping of transistors.

FIG. 1 depicts densely packed transistors arranged within and upon a test area of a substrate. Polysilicon gate conductors 12, 14, and 16 are spaced parallel to each other across a horizontal plane. Gate conductors 12, 14 and 16 are laterally spaced relatively close to each other, e.g., less than 0.3 micron apart to form, e.g., a series-connected grouping of transistors. The test area and, specifically, the gate conductors 12, 14 and 16 are used to replicate similar, series-connected transistors within the active die areas of the semiconductor wafer. Accordingly, source/drain regions 20 of the substrate which are each mutually shared by two transistors have relatively small lateral widths. Because source/drain regions 18 are not confined between closely spaced gate conductors, they have larger lateral widths than source/drain regions 20. The small distance between gate conductors 12 and 14 and between gate conductors 14 and 16 afford high speed series-connected operation of, e.g., a multiple input logic device. Contacts would not normally be formed to source/drain regions 20 since an output would not ordinarily be present from regions 20. Attempts to place contacts to source/drain regions 20, e.g., for testing a single transistor of the series-connected transistor within the test area would be difficult at best.

Contact formation involves etching a contact opening, i.e., a via, through an interlevel dielectric, followed by filling the contact opening with a conductive material. A well-known technique known as "lithography" is used to pattern a photosensitive film, i.e., photoresist, above the interlevel dielectric to define the region to be etched. The portions of the interlevel dielectric to be removed are exposed while those portions to be retained are protected by the photoresist which remains intact during the etch step. The lateral width (i.e., the distance between opposed lateral edges) of the contact is thus mandated by the minimum lateral dimension that can be achieved for lithographically patterned features. Unfortunately, the minimum lateral dimension that can be defined using lithography is limited by, inter alia, the resolution of the optical system (i.e., aligner or printer) used to project an image onto the photoresist. The term "resolution" describes the ability of an optical system to distinguish closely spaced objects. Therefore, the lateral width of a contact formed to one of the source/drain regions 20 could not be less than the lateral distance between adjacent gate conductors, particularly since the distance between gate conductors is also dictated by lithography.

Perfect alignment of a photoresist pattern to the targeted features of a semiconductor substrate is rarely achievable. Thus, it is highly probable that the photoresist pattern used to define the region of the interlevel dielectric to be etched would be misaligned, resulting in contacts being shifted laterally from their targeted positions. If contacts were to be formed to source/drain regions 20, portions of at least two of the gate conductors 12, 14, and 16 most likely would be undesirably etched. Consequently, the original lateral width of each gate conductor would be reduced, and the etched gate conductors would no longer be positioned immediately adjacent one of the source/drain regions 20. Further, conductive material deposited into the contact openings would undesirably communicate with the etched gate conductors. An electrical short could thus be formed between the etched gate conductors and adjacent source/drain regions 20, rendering the transistors inoperable. Alternately, the contacts could only be electrically linked to the etched gate conductors, making it impossible to pass electrical signals to and receive electrical signals from source/drain regions 20 for the purpose of testing a single transistor within the series-connected chain. The distinct properties of each of the transistors employing source/drain regions 20 thus could not be determined. Forming contacts to source/drain regions 20 in order to determine the characteristics of the transistors would in effect make it impossible to determine the properties of the devices in their original configuration. Therefore, forming contacts to source/drain regions 20 would defeat the purpose of creating the contacts in the first place.

To avoid the problems incurred when forming contacts to source/drain regions aligned between closely spaced gate conductors, conventional methods have turned to other means for electrically testing the device properties. As shown in FIG. 1, contacts 22 may be formed to source/drain regions 18 without damaging adjacent gate conductors 12 and 16 since regions 18 are not bound between closely-spaced gate conductors. Source/drain regions 18 are larger in lateral dimension than the minimum lateral dimension of lithographically patterned features. Accordingly, the lateral width of each contact may be reduced significantly below that of each source/drain region 18. Thus, even if the photoresist pattern used to define the contacts is mis-aligned, some space in which the contacts may be formed still exists between the targeted contact positions and the gate conductors. Consequently, contact openings may be etched through a dielectric to source/drain regions 18 without risking the removal of portions of gate conductors 12, 14, and 16. Contacts 22 may be electrically linked to probe pads 26 by horizontally extending conductors 24 formed a spaced distance above the substrate. Another set of conductors 28 may be formed to electrically link each of the gate conductors 12, 14, and 16 to one of the probe pads 29.

Unfortunately, absent the formation of contacts to source/drain regions 20, the individual properties of each transistor belonging to the series-connected group of transistors are difficult to measure accurately using electrical testing. For example, if PMOSFET transistors are connected in series, an attempt may be made to determine $I_D$ of one of the transistors by (a) applying a voltage, $-V_{DD}$, to gate conductors 12 and 16 to drive the corresponding transistors into saturation, (b) applying a voltage, $-V_{DD}$, to one of the source/drain regions 18, (c) modulating a voltage, $V_{gs}$, applied to the gate conductor 14 until the corresponding transistor begins to operate (i.e., $V_{gs} > V_T$, the threshold voltage), and (d) grounding or applying a voltage that is at least one threshold below $V_{DD}$ to the other of the source/drain regions 18, (i.e., the output source/drain region 18). Electrical signals may be applied to gate conductors 12, 14, and 16 and source/drain regions 18 by contacting electrical probes to the probe pads 29 electrically linked to those gate conductors and to the probe pads 26 coupled to those source/drain regions. The current passing to the output source/drain region 18 may be measured by contacting an electrical probe to the corresponding one of the probe pads 26. Although two of the series-connected transistors are operating in the saturation region at which the transistor drive current has reached its upper limit (i.e., saturation drive current, $I_{sat}$), the channel regions underneath gate conductors 12 and 16 still exhibit some parasitic resistance to current flow. Consequently the current passing to the output source/drain region 18 is not the true drive current, $I_D$, of the transistor which employs gate conductor 14. As such, the distinct characteristics of a single transistor belonging to a series-connected assembly of densely packed transistors as shown in FIG. 1 cannot be determined using conventional techniques.

It would therefore be of benefit to develop a test structure and method for determining the distinct properties of each transistor belonging to a plurality of closely spaced, series-connected transistors. Thus, a test structure is required in which contacts could be formed to the source/drain regions of a single transistor within a series-connected sequence of transistors. The test structure must therefore be one that can determine characteristics of the single transistor and not be hindered by the other transistors within the test structure and/or the other transistors within the sequence of series-connected transistors. That is, it would be desirable if sufficient connectivity can be gained to the single transistor while totally discarding effects from neighboring transistors. Accordingly, it would also be desirable to characterize the single transistor without relying on the neighboring transistors to pass current and/or voltage to and from the transistor. A test structure is thus needed which would allow current to flow to a transistor being tested in the absence of parasitic resistance created by the channel regions of the neighboring transistors within a series-connected sequence of transistors typically associated with a multiple-input logic gate. Electrical testing of such a test structure could be used to determine the true properties of a transistor within a multiple-input logic gate.

SUMMARY OF THE INVENTION

The problems outlined above are in large part solved by the test structure hereof, and a method for using the test structure to determine the distinct characteristics of each transistor arranged in a densely packed configuration with other transistors. The test structure is fabricated upon a test area of a semiconductor substrate. Closely spaced gate conductors having relatively small lateral widths, i.e., physical gate lengths, are formed above the test area, according to the design of an integrated circuit device, e.g., a multiple input logic device, which employs series-connected transistors. All of the gate conductors arranged above the test area, with the exception of the one being subjected to testing, are then etched away.

Source/drain implants which are self-aligned to the opposed sidewall surfaces of the gate conductor retained above the test area are forwarded into the substrate. Absent the other gate conductors, the resulting source/drain regions of the substrate extend laterally to an isolation region arranged within the substrate. The isolation region is spaced from the gate conductor by a distance greater than the distance between the pre-existing gate conductors. As such, the lateral width of contacts formed through an interlevel dielectric to the source/drain regions may be made significantly less than the lateral width of each source/drain region. The targeted positions of the contacts are chosen such that even if the contacts are mis-aligned they will be formed a spaced distance from the sole remaining gate conductor. Therefore, the contacts, and hence the contact openings, may be formed without being concerned that portions of the gate conductor might be etched and that the contacts might electrically communicate with the gate conductor. Accordingly, it would be less likely for an electrical short to form between the gate conductor and an adjacent source/drain region.

Advantageously, an electrical signal may be routed to the resulting transistor absent the flow of current to that transistor through the channel regions of other transistors which are connected in series to that transistor. An electrical signal may be communicated to one of the source/drain regions by applying the signal directly to a probe pad which is electrically linked to the source/drain region. Further, the properties of the resulting transistor may be determined by reading an electrical signal directly from the probe pad which is coupled to the drain region of the transistor, rather than from a probe pad coupled to a drain region of another transistor. Otherwise, the channel regions of the series-connected transistors would add resistance to the flow of current to and from the transistor being characterized, making it impossible to determine the distinct properties of that transistor. Therefore, the test structure hereof may be used to determine the true properties of a transistor, despite the transistor having been fabricated in a densely packed configuration with other series-connected transistors.

According to an embodiment of the present invention, the test structure is formed by first depositing a polysilicon layer across a gate dielectric that is arranged upon a test area of a semiconductor substrate. Portions of the polysilicon layer and the gate dielectric are then etched away to define sidewall surfaces of multiple polysilicon gate conductors dielectrically spaced above the substrate. The gate conductors are laterally spaced apart by a relatively short distance. An isolation region is arranged within the substrate a spaced distance from the "end" gate conductors which are not interposed between two other gate conductors. All except one of the gate conductors arranged above the test area and their underlying gate dielectrics are then removed from above the substrate. Dopant species which are opposite in type to the dopant species arranged within the semiconductor substrate are then implanted into exposed regions of the substrate to form source/drain regions directly adjacent the remaining gate conductor. Thereafter, an interlevel dielectric is deposited across the resulting topological surface of the semiconductor topography. Contacts are formed through the interlevel dielectric to the source/drain regions. Horizontally extending conductors are formed dielectrically spaced above the substrate to electrically link each of the contacts to a probe pad. Further, a conductor is formed which electrically links the gate conductor to a probe pad.

Various electrical tests may be performed on the test structure to determine the distinct properties of the transistor. For example, a voltage, $V_{DD}$, may be applied to the probe pad that is electrically linked to one of the source/drain regions while the other source/drain region is grounded. A gate-to-source voltage, $V_{gs}$, which is greater than the transistor threshold voltage, $V_T$, is simultaneously applied to the probe pad that is electrically linked to the gate conductor. The drive current, $I_D$, of the now-operating transistor may then be measured by contacting a probe to the probe pad that is electrically linked to the drain.

BRIEF DESCRIPTION OF THE DRAWINGS

Other objects and advantages of the invention will become apparent upon reading the following detailed description and upon reference to the accompanying drawings in which.

Figure 1:
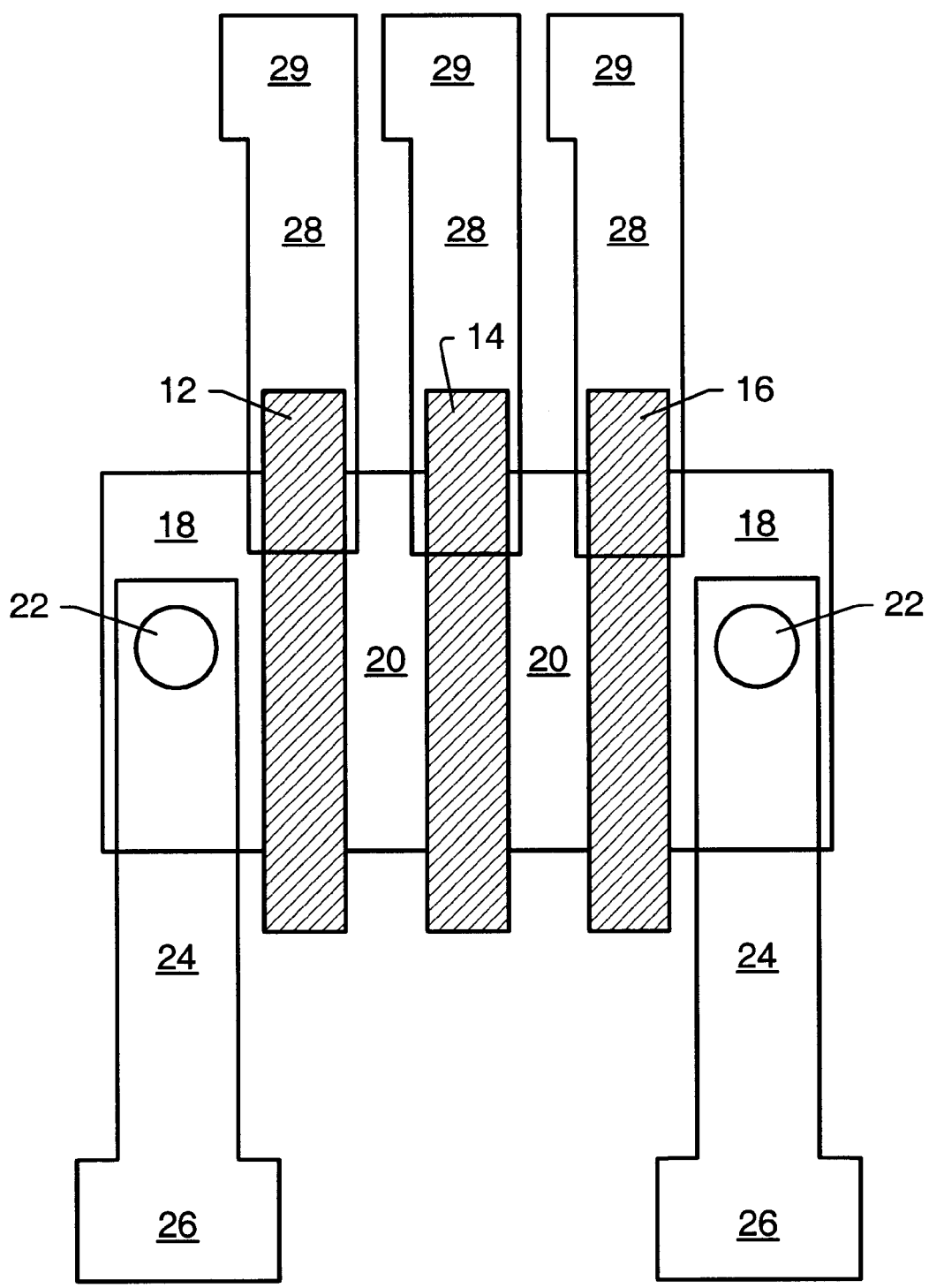
FIG. 1 depicts a top plan view of a semiconductor topography according to conventional design, wherein transistors are densely packed upon and within a unitary substrate and probe pads are electrically linked to those source/drain regions of the substrate that are not interposed between closely spaced gate conductors.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
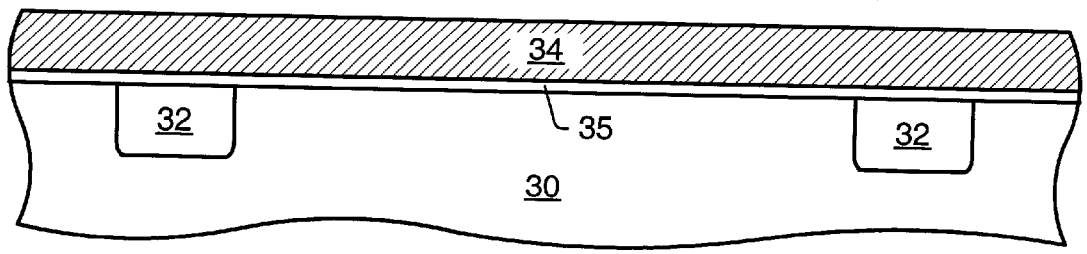
FIG. 2 depicts a cross-sectional view of a semiconductor topography according to an embodiment of the present invention, wherein a polysilicon layer is deposited across a gate dielectric arranged upon a semiconductor substrate.

Turning to FIG. 2, a partial cross-sectional view of a test area of a semiconductor substrate 30 is depicted upon which a test structure is to be formed. Substrate 30 comprises single crystalline silicon which has been lightly doped with either n-type or p-type dopant species. Dielectric isolation regions, such as shallow trench isolation structures 32, are arranged spaced distances apart within substrate 30 for dielectrically isolating ensuing active areas. The dielectric isolation regions may alternately include well known LOCOS structures. Substrate 30 is slightly doped with n-type or p-type impurities. A gate dielectric 35 is formed across substrate 30 by, e.g., subjecting silicon-based substrate 30 to thermal radiation in an oxygen bearing ambient. As such, gate dielectric 35 may be a thermally grown oxide. A polysilicon layer 34 may be formed across gate dielectric 35 using chemical-vapor deposition ("CVD") of polysilicon from, e.g., a silane source.

Figure 3:
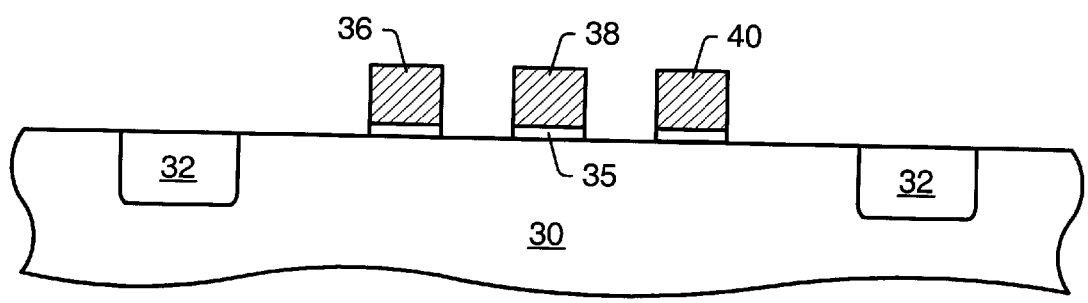
FIG. 3 depicts a cross-sectional view of the semiconductor topography, wherein portions of the polysilicon layer and the gate dielectric are etched from above the substrate to define a set of closely spaced gate conductors, subsequent to the step in FIG. 2.
Figure 4:
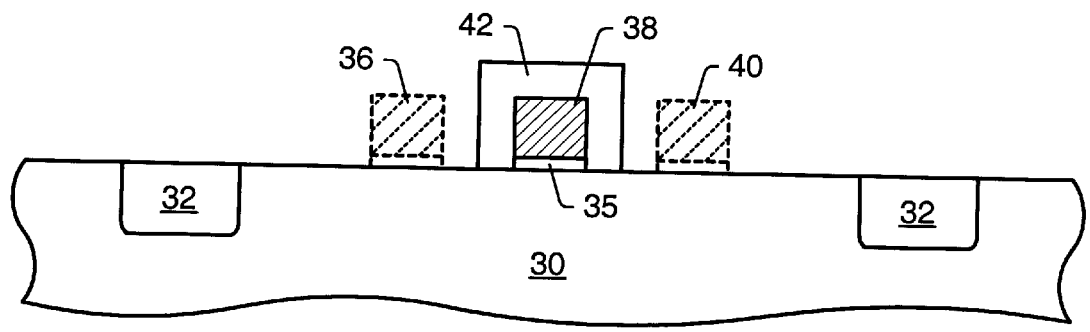
FIG. 4 depicts a cross-sectional view of the semiconductor topography, wherein all but one of the gate conductors is removed from above the semiconductor substrate, subsequent to the step in FIG. 3.

As shown in FIG. 3, portions of polysilicon layer 34 and gate dielectric 35 are then removed to form polysilicon gate conductors 36, 38, and 40 dielectrically spaced above substrate 30. Gate conductors 36, 38, and 40 are formed by first patterning a photoresist layer across select regions of polysilicon layer 34 using lithography. Those portions of polysilicon layer 34 which are unprotected by overlying photoresist are then etched using, e.g., a dry, plasma etch. The etch duration is chosen to terminate before substantial portions of substrate 30 are removed. Turning to FIG. 4, a masking structure 42 is patterned across gate conductor 38. Masking structure 42 is preferably composed of photoresist that has been patterned using lithography. Gate conductors 36 and 40 and a portion of the gate dielectrics underlying gate conductors 36 and 40 may then be removed using an etch technique, e.g., a dry, plasma etch. Masking structure 42, being substantially resistant to the etch technique, prevents the removal of gate conductor 38.

Figure 5:
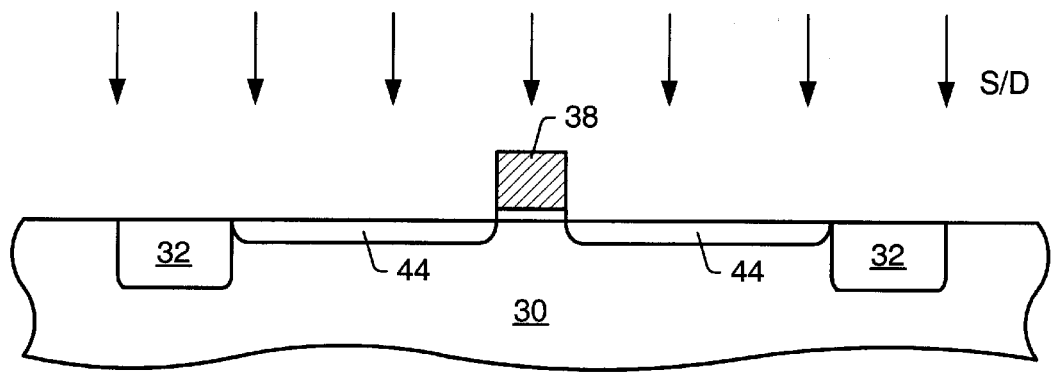
FIG. 5 depicts a cross-sectional view of the semiconductor topography, wherein source/drain implants that are self-aligned to the opposed sidewall surfaces of the gate conductor are forwarded into the substrate, subsequent to the step in FIG. 4.

As demonstrated in FIG. 5, dopant species are then implanted into substrate 30 at a relatively high dose and energy to form first and second source/drain regions 44. If a PMOSFET device is being formed, ion implantation of p-type species is performed, and if an NMOSFET device is being formed, n-type species are implanted into substrate 30. Some commonly used n-type dopants are arsenic or phosphorus, and some commonly used p-type dopants are boron or boron difluoride. Gate conductor 38 serves as a mask during the source/drain implant to inhibit dopant species from passing into the channel region of the substrate underneath gate conductor 38. The dopant species that become positioned within gate conductor 38 advantageously serve to lower the resistivity of the gate conductor. A post-implant anneal may be performed to activate and position the as-implanted impurities.

Figure 6:
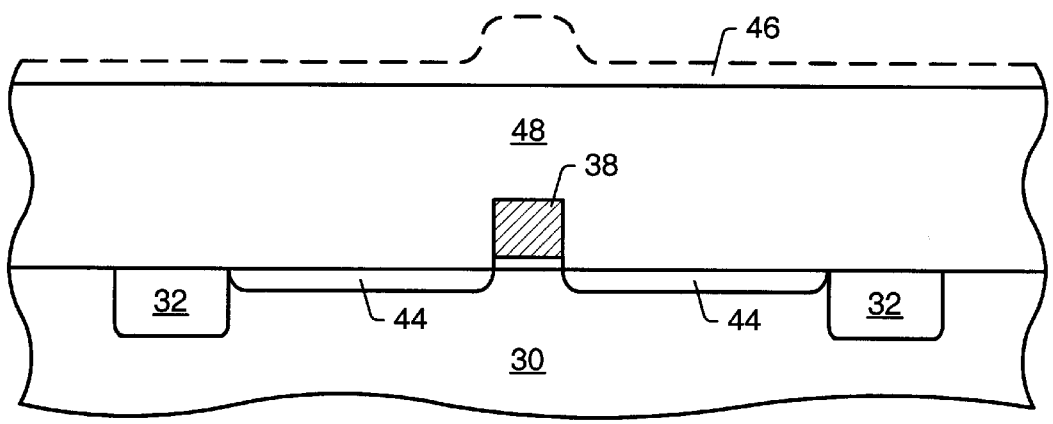
FIG. 6 depicts a cross-sectional view of the semiconductor topography, wherein an interlevel dielectric is formed across exposed surfaces of the gate conductor and the substrate, subsequent to the step in FIG. 5.
Figure 7:
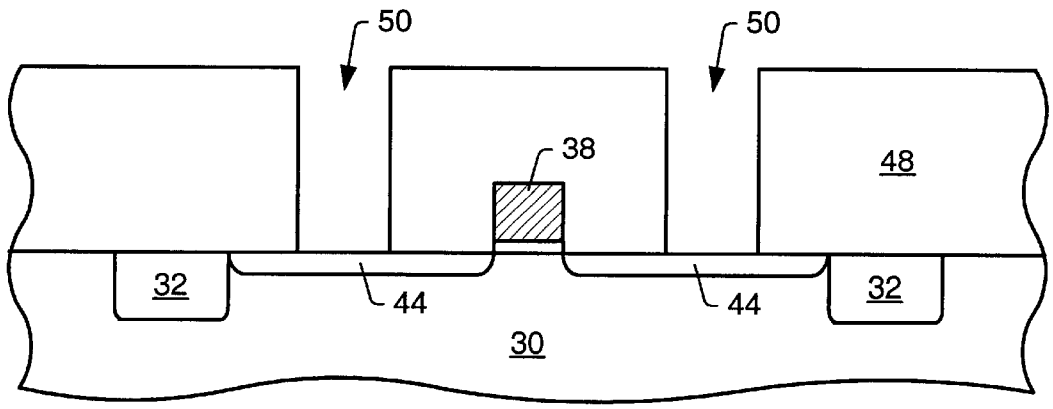
FIG. 7 depicts a cross-sectional view of the semiconductor topography, wherein contact openings are etched through the interlevel dielectric to the source/drain regions, subsequent to the step in FIG. 6.
Figure 8:
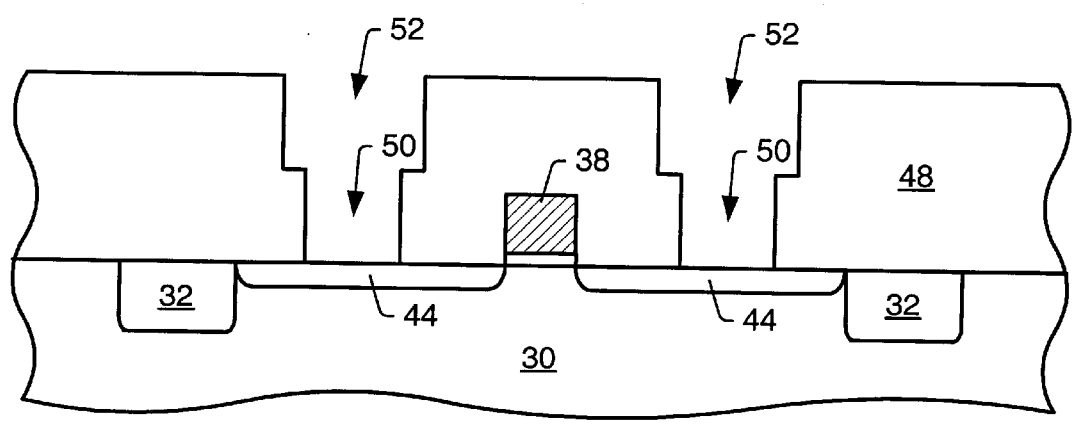
FIG. 8 depicts a cross-sectional view of the semiconductor topography, wherein horizontally extending trenches which communicate with the contact openings are etched in the interlevel dielectric a spaced distance above the substrate, subsequent to the step in FIG. 7.

FIG. 6 depicts the formation of an interlevel dielectric 48 across exposed surfaces of substrate 30 and gate conductor 38. Interlevel dielectric 48 may be formed by the deposition of an oxide- or glass-based dielectric material 46. Dielectric material 46 may then be subjected to chemical-mechanical polishing ("CMP") to remove the surface of the dielectric material down to a level spaced above substrate 30. The surface of the resulting interlevel dielectric 48 is substantially planar. As shown in FIG. 7, contact openings 50 may then be formed through interlevel dielectric 48 to source/drain regions 44 using optical lithography and an etch technique, e.g., a dry, plasma etch. FIG. 8 depicts the formation of horizontally extending trenches 52 a spaced distance above substrate 30. Trenches 52, which communicate with contact openings 50, are etched within interlevel dielectric 48.

Figure 9:
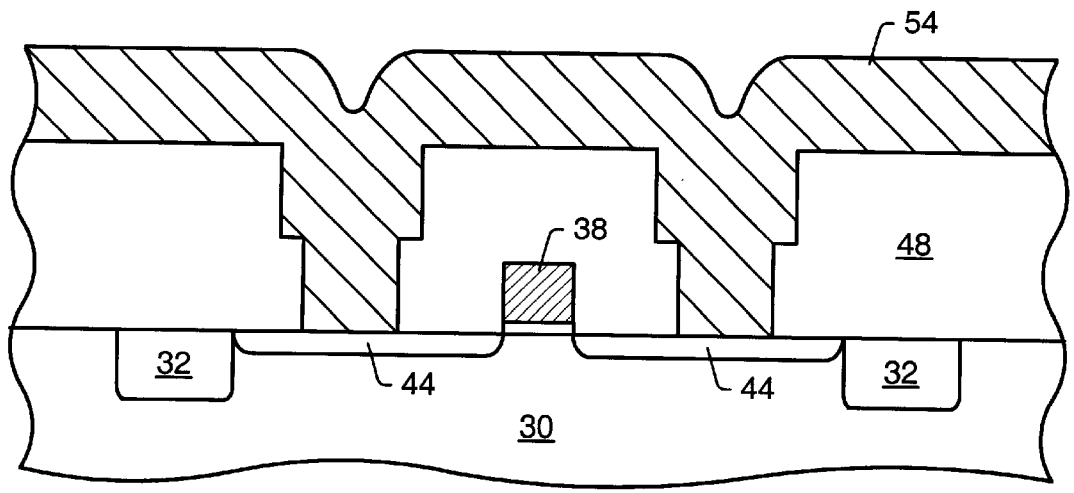
FIG. 9 depicts a cross-sectional view of the semiconductor topography, wherein a conductive material is deposited into the contact openings and the trenches to a level spaced above the upper surface of the interlevel dielectric, subsequent to the step in FIG. 8.
Figure 10:
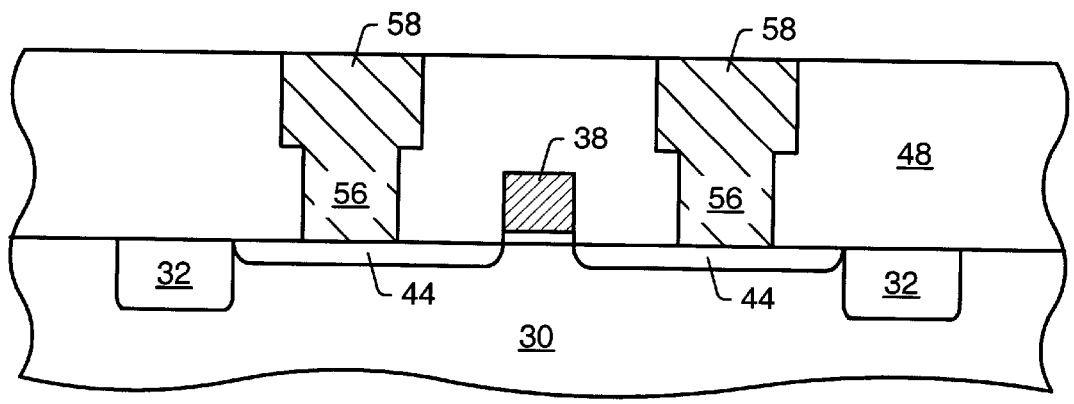
FIG. 10 depicts a cross-sectional view of the semiconductor topography, wherein the conductive material and the interlevel dielectric are removed down to a level slightly below the original elevation of the upper surface of the interlevel dielectric to form contacts and conductors, subsequent to the step in FIG. 9.

Turning to FIG. 9, a conductive material 54, e.g., tungsten, is deposited into contact openings 50 and trenches 52 to an elevational level spaced above the upper surface of interlevel dielectric 48. As depicted in FIG. 10, the upper surface of conductive material 54 and the upper surface of interlevel dielectric 48 may then be removed down to a level spaced slightly below the original elevational position of the upper surface of interlevel dielectric 48 using, e.g., CMP. In this manner, horizontally extending conductors 58 and contacts 56 are formed in electrical communication with source/drain regions 44. The resulting planar upper surface of the semiconductor topography is shared by interlevel dielectric 48 and conductors 58. Alternatively, contacts 56 may be formed prior to the formation of conductors 58, and contacts 56 and conductors 58 may be composed of different materials.

Figure 11:
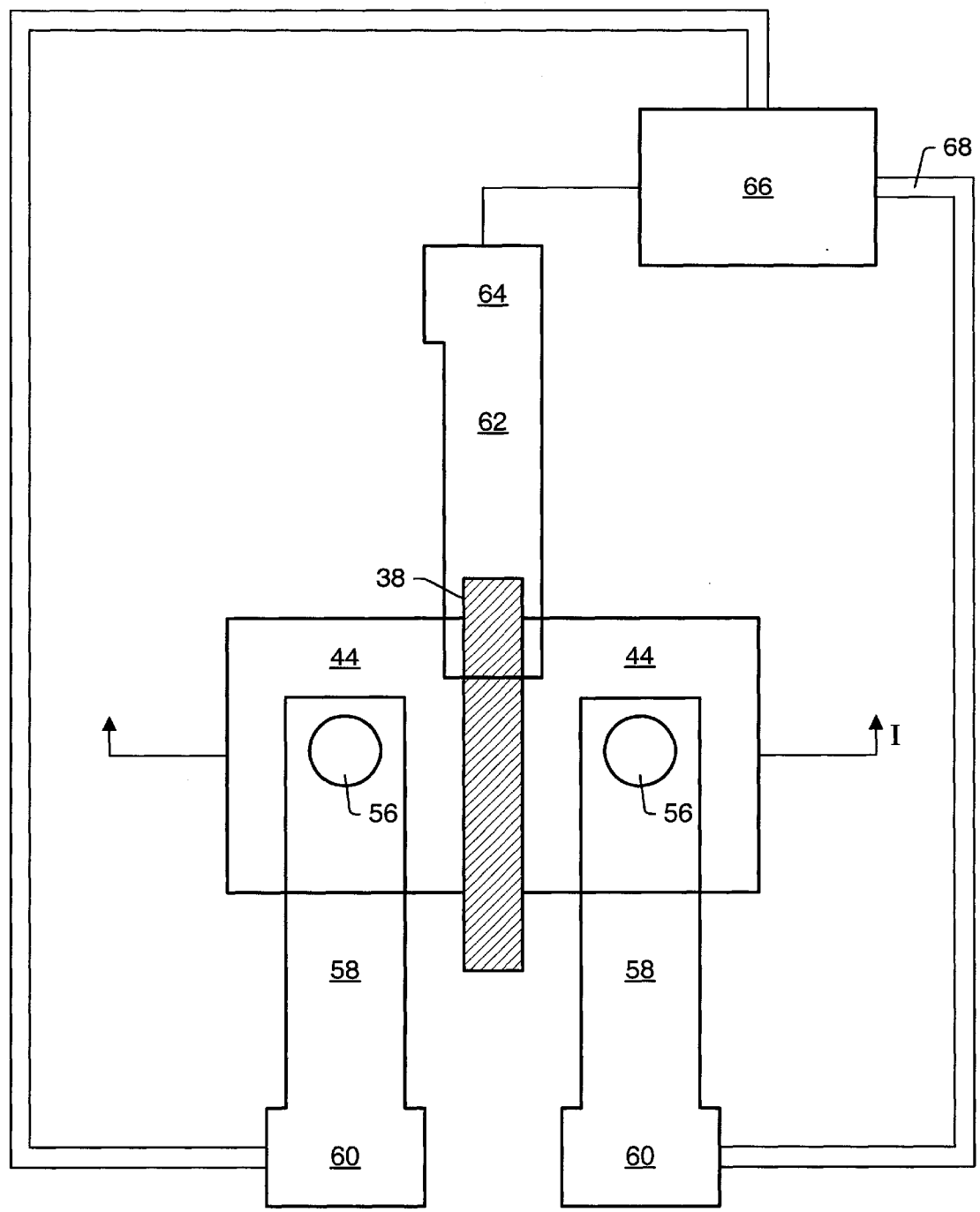
FIG. 11 depicts a top plan view of the semiconductor topography in which probe pads are electrically linked to the source/drain regions by the conductors and another probe pad is electrically linked to the gate conductor by another conductor, wherein the cross-sectional view shown in FIG. 10, and preceding steps which culminate in FIG. 10, extends along plane I of FIG. 10.

FIG. 11 depicts a top plan view of the resulting test structure. The cross-sectional view of FIG. 10 extends along plane I of FIG. 11. Each conductor 58 extends horizontally from the contact 56 to a probe pad 60. Another conductor 62 is also formed a spaced distance above the test area of substrate 30. Conductor 62 extends across an end portion of gate conductor 38 to another probe pad 64, electrically linking gate conductor 38 to probe pad 64. Probe pads 60 and 64 and conductor 62 are formed within interlevel dielectric 48 in a similar manner to the formation of conductors 58. It is to be understood that conductors 58 and 62 may be arranged in a different orientation to that shown in FIG. 11 and that probe pads 60 and 64 may also be arranged at different locations to those illustrated. FIG. 11 also depicts a signal generator/detector 66, e.g., a three-point probe, for applying and receiving electrical signals to probe pads 60 and 64. The electrical signals pass from signal generator/detector 66 to probe pads 60 and 64, and vice versa, through electrical wires 68.

The test structure depicted in FIG. 11 may be used to determine the distinct properties of the transistor which employs source/drain regions 44 and gate conductor 38. Electrical testing of the transistor may, in one case, involve applying a voltage, $V_{gs}$ that is greater than $V_T$ to probe pad 64 (coupled to gate conductor 38) and applying another voltage, $V_{DD}$, to one of the probes pad 60 (coupled to one of the source/drain regions 44). The probe pad 60 to which no voltage is applied as well as the bulk substrate 30 are grounded. In this manner, the channel region of the substrate 30 underlying gate conductor 64 may be inverted, and a drive current, $I_D$, may flow between source/drain regions 44. Drive current, $I_D$, of the transistor may be determined by contacting a probe to the drain-side probe pad 60 and using signal generator/detector 66 to measure $I_D$. The subthreshold current, $I_{st}$, of the transistor may also be determined by applying a voltage to one of the probe pads 60, grounding the other of the probe pads 60, grounding the substrate, and grounding probe pad 64. If any current leaks between source/drain regions 44, it will be detected at the drain-side probe pad 60.

Figure 12:
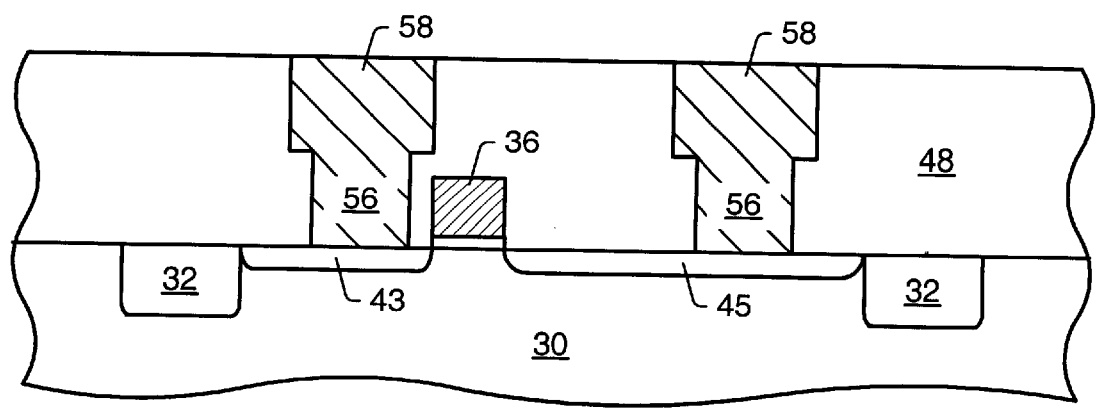
FIG. 12 depicts a cross-sectional view of the semiconductor topography in an alternative embodiment for which gate conductor 36, rather than gate conductor 38, is retained in the step of FIG. 4, and the steps of FIGS. 5 through 10 are subsequently carried out.

A partial cross-sectional view of an alternative embodiment of the test structure is shown in FIG. 12. As noted above, the method described herein may be used to allow access to each transistor in a densely packed configuration with other transistors. The gate conductor removal of FIG. 4, therefore, may be done such that, for example, gate conductor 36 is retained rather than gate conductor 38. In such an embodiment, following through the method as shown in FIGS. 5–10 results in the structure of FIG. 12, in which the first and second source/drain regions 43 and 45 are of unequal lateral width, since gate conductor 36 is not centered between isolation regions 32.

It will be appreciated to those skilled in the art having the benefit of this disclosure that this invention is believed to provide a test structure and method for determining the distinct properties of each transistor densely packed upon and within a unitary substrate. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A transistor test structure comprising:

a gate conductor arranged above a semiconductor substrate;

first and second source/drain regions arranged laterally adjacent opposed sidewall surfaces of the gate conductor within the semiconductor substrate, wherein the first source/drain region has a larger lateral width than the second source/drain region, and the first and second source/drain regions extend laterally from the adjacent opposed sidewall surfaces of the gate conductor within the semiconductor substrate to the respective outer edges of the active region of the semiconductor substrate;

an interlevel dielectric arranged across the semiconductor substrate and the gate conductor; and first and second contacts extending through the interlevel dielectric to the first and second source/drain regions, respectively.

2. The transistor test structure of claim 1, wherein the gate conductor comprises doped polysilicon.

3. The test structure of claim 1, wherein the lateral width of the first source/drain region exceeds that of the second source/drain region by an amount greater than or equal to the lateral width of the gate conductor.

4. The test structure of claim 1, wherein the lateral width of the first source/drain region exceeds that of the second source/drain region by an amount greater than or equal to twice the lateral width of the gate conductor.

5. The transistor test structure of claim 1, further comprising a first conductor extending across the interlevel dielectric and contacting the first contact, and further comprising a first probe pad electrically linked to the first conductor.

6. The transistor test structure of claim 5, further comprising a second conductor extending across the interlevel dielectric and contacting the first gate conductor, and further comprising a second probe pad electrically linked to the second conductor.

7. A system for electrically testing densely packed transistors, comprising:

a test structure comprising:
    a gate conductor arranged above a semiconductor substrate;
    first and second source/drain regions arranged laterally adjacent opposed sidewall surfaces of the gate conductor within the semiconductor substrate, wherein the first source/drain region has a larger lateral width than the second source/drain region, and the first and second source/drain regions extend laterally from the adjacent opposed sidewall surfaces of the gate conductor within the semiconductor substrate to the respective outer edges of the active region of the semiconductor substrate;
    an interlevel dielectric arranged across the semiconductor substrate and the gate conductor;
    first and second contacts extending through the interlevel dielectric to the first and second source/drain regions, respectively;
    a first conductor spaced above the substrate which extends horizontally between the first contact and a first probe pad; and
    a second conductor spaced above the substrate which extends horizontally between the gate conductor and a second probe pad; and a device adapted to pass an electrical signal to the second probe pad.

8. The system of claim 7, wherein the device is adapted to read another electrical signal responsive to the electrical signal from the first probe pad.

9. The system of claim 7, wherein the lateral width of the first source/drain region exceeds that of the second source/drain region by an amount greater than or equal to the lateral width of the gate conductor.

10. The system of claim 7, wherein the lateral width of the first source/drain region exceeds that of the second source/drain region by an amount greater than or equal to twice the lateral width of the gate conductor.

11. A transistor test structure, comprising:

a first gate conductor arranged above a semiconductor substrate;

a masking layer arranged upon and around the first gate conductor, the masking layer being configured to inhibit etching of the first gate conductor, wherein the masking layer comprises photoresist;

a second gate conductor arranged above the semiconductor substrate and laterally adjacent to and at the same elevational level as the first gate conductor, wherein the second gate conductor is not covered by the masking layer; and a third gate conductor arranged above the semiconductor substrate and laterally adjacent to and at the same elevational level as the first gate conductor, such that the first gate conductor is interposed between the second gate conductor and the third gate conductor, and wherein the third gate conductor is not covered by the masking layer.

12. The transistor test structure of claim 11, wherein the test structure is configured such that the second and third gate conductors may be removed by etching without etching the first gate conductor.

13. The transistor test structure of claim 11, wherein the masking layer is in contact with the upper surface of the semiconductor substrate.

14. The transistor test structure of claim 11, wherein the second and third gate conductors are uncovered.

15. The transistor test structure of claim 14, wherein the first, second, and third gate conductors are coplanar.

16. The transistor test structure of claim 15, wherein the first, second, and third gate conductors are each spaced from the semiconductor substrate only by respective underlying gate dielectrics.

17. The transistor test structure of claim 11, wherein a distance between the first and second gate conductors is approximately equal to the width of the first gate conductor.

18. The transistor test structure of claim 17, wherein the distance between the first and third gate conductors is approximately equal to the width of the first gate conductor.

19. The transistor test structure of claim 18, wherein the distances between the first and second gate conductor and between the first and third gate conductor are less than 0.3 microns.

* * * * *